United States Patent [19]

Aoyagi et al.

[11] 4,433,293

[45] Feb. 21, 1984

[54] METHOD AND APPARATUS FOR DETECTING ABNORMAL CONDITIONS OF CIRCUIT BREAKERS

[75] Inventors: Akira Aoyagi; Shinichi Ikeda, both of Yokohama, Japan

[73] Assignee: Tokyo Shibaura Denki Kabushiki Kaisha, Kanagawa, Japan

[21] Appl. No.: 246,061

[22] Filed: Mar. 20, 1981

[30] Foreign Application Priority Data

Mar. 31, 1980 [JP] Japan .............................. 55-40250

[51] Int. Cl.³ .............................................. G01R 31/32

[52] U.S. Cl. .................................... 324/424; 324/420; 200/148 A; 200/81.5

[58] Field of Search ............... 324/424, 454, 209, 415, 324/452, 456, 418, 417, 420; 335/6; 200/81 R, 81.5, 82 R, 82 A, 148 A; 73/593

[56] References Cited

U.S. PATENT DOCUMENTS 2,660,635 11/1953 Wood .............................. 200/81.5
3,311,726 3/1967 Fish .............................. 200/148 A
4,159,446 6/1979 Darrel et al. ...................... 324/424

FOREIGN PATENT DOCUMENTS 2813536 10/1978 Fed. Rep. of Germany .
537264 11/1976 U.S.S.R. .............................. 73/593

*Primary Examiner*—Michael J. Tokar
*Assistant Examiner*—Kevin O'Shea
*Attorney, Agent, or Firm*—Stevens, Davis, Miller & Mosher

[57] ABSTRACT

Abnormal conditions of a tank type gas circuit breaker are detected by driving a movable contact with a drive force and at a speed respectively lower than normal drive force and speed. Measuring units are mounted on various portions of a casing of the circuit breaker without disassembling the same and measured data are displayed for comparison.

5 Claims, 7 Drawing Figures

METHOD AND APPARATUS FOR DETECTING ABNORMAL CONDITIONS OF CIRCUIT BREAKERS

BACKGROUND OF THE INVENTION

This invention relates to a method and apparatus for detecting abnormal conditions or faults of a circuit breaker from outside thereof.

About 90% of the faults of a circuit breaker are mechanical faults such as leakage of air, gas or oil, a fracture and inoperative state or an improper operation of the circuit breaker itself or an operating mechanism thereof. The leakage of air, gas or oil can be detected with a pressure relay for producing an alarm signal whereas an inoperable state or improper operation can not be detected until such faults occur because in most cases, various elements of the circuit breaker do not move but should be moved as desired when a fault occurs on a power circuit.

With recent increases in the demand for power, the operating voltage and capacity of the circuit breaker increases year by year and any fault or abnormal condition thereof results in a serious problem.

SUMMARY OF THE INVENTION

Accordingly, it is an object of this invention to provide a method and apparatus capable of readily detecting abnormal condition or faults of a circuit breaker before they occur.

Another object of this invention is to provide a novel method and apparatus capable of detecting, readily and at high sensitivities, such abnormal conditions of a circuit breaker as sluggish movement, loose connection between movable portions and increases in the contact resistance and slide resistance at their earlier stages.

According to one aspect of this invention, there is provided a method of detecting an abnormal condition of a circuit breaker comprising the steps of driving a movable portion of the circuit breaker at a lower speed than a normal operating speed; concurrently measuring a plurality of examination data regarding operating force and speed at the time of low speed drive; and comparing measured examination data with those obtained when the circuit breaker is operated at the low drive speed under a state in which there is no abnormal condition.

According to another aspect of this invention, there is provided apparatus for detecting an abnormal condition of a circuit breaker including a movable contact contained in a sealed casing and an operating mechanism for operating the movable contact with a predetermined speed, the apparatus comprising means for driving the movable contact with a speed lower than a normal operating speed, a plurality of measuring units mounted on the casing for producing electric signals representing examination data, and means for displaying the electric signals for comparison.

DESCRIPTION OF THE PREFERRED EMBODIMENTS

Figure 1:
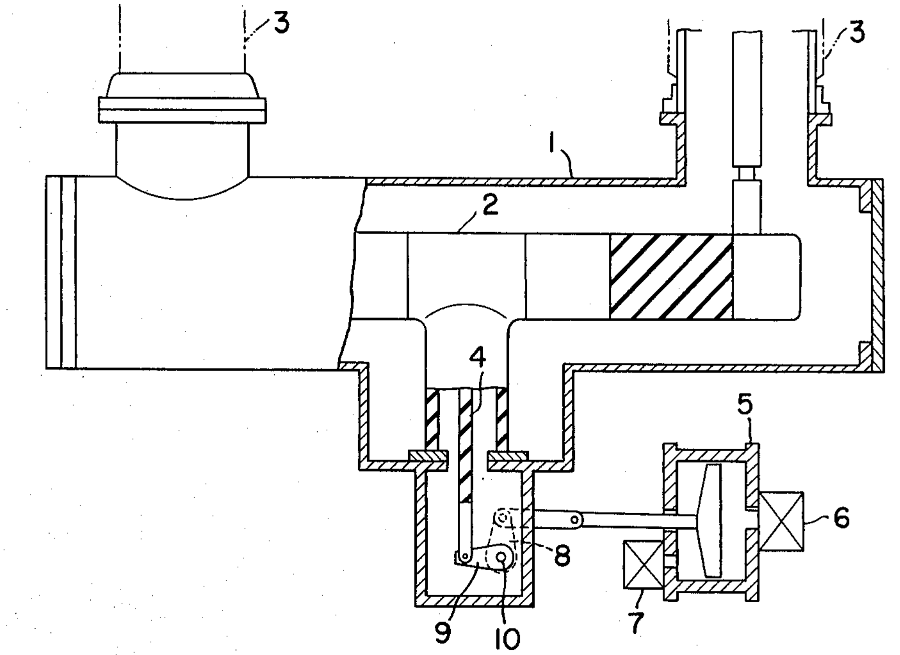
FIG. 1 PRIOR ART
FIG. 1 is a diagrammatic representation, partly in section, of a typical tank type gas circuit breaker to which the invention is applicable.

A gas tank 1 of a tank type gas circuit breaker shown in FIG. 1 is filled with such insulating gas as $SF_6$ and contains therein a circuit breaker 2 of a well known construction. Insulation bushings 3 are mounted on the gas tank 1 for passing lead conductors connected to an electric power circuit, not shown. The circuit breaker 2 is operated by an operating cylinder 5 disposed on the outside of the gas tank 1 via an insulating rod 4, and crank levers 8 and 9 pivoted by a pivot pin 10. The pin 10 air tightly extends through the lower casing of tank 1 and crank lever 8 is connected to one end of pin 10 on the outside of the casing. The operating cylinder 5 is provided with control valves 6 and 7 for admitting and discharging into and out of the cylinder pressurized fluid.

The mechanical reliability of a circuit breaker has been tested in accordance with a provision of the Japanese Electrotechnical Committee (JEC)—181, 1975 or by repeating, for 10,000 times, opening and closing operations. As is well known in the art, with these tests, contact opening time, stroke of the movable contact, contact closing time, operating voltage, etc., are measured simultaneously. Furthermore, with regard to the operating voltage, gas pressure and control voltage, etc., tests are made not only under rated values but also under maximum and minimum values. Combinations of these values are also defined in JEC-181 so that the maker of a circuit breaker performs tests thereof under the combination before shipping for the purpose of confirming the reliability of the circuit breaker.

However, as is well known the circuit breaker is required to operate at a high speed of the order of 5–10 m/sec. (hereinafter termed normal speed), it requires a strong operating force.

Since increase in the operating force caused by wear of sliding parts or sluggish movement is relatively small, it has been impossible or difficult to detect such conditions with prior art operating tests. Moreover, the operation of a circuit breaker accompanies shocks which tend to loosen pin connections or bearings. Such conditions were also difficult to detect at an earlier stage. Sluggish movement of sliding parts in the gas tank 1 produces metal particles which result in a ground fault. Further, an irregular or incorrect engagement of contact fingers increases contact resistance and hence causes local overheating.

Figure 2:
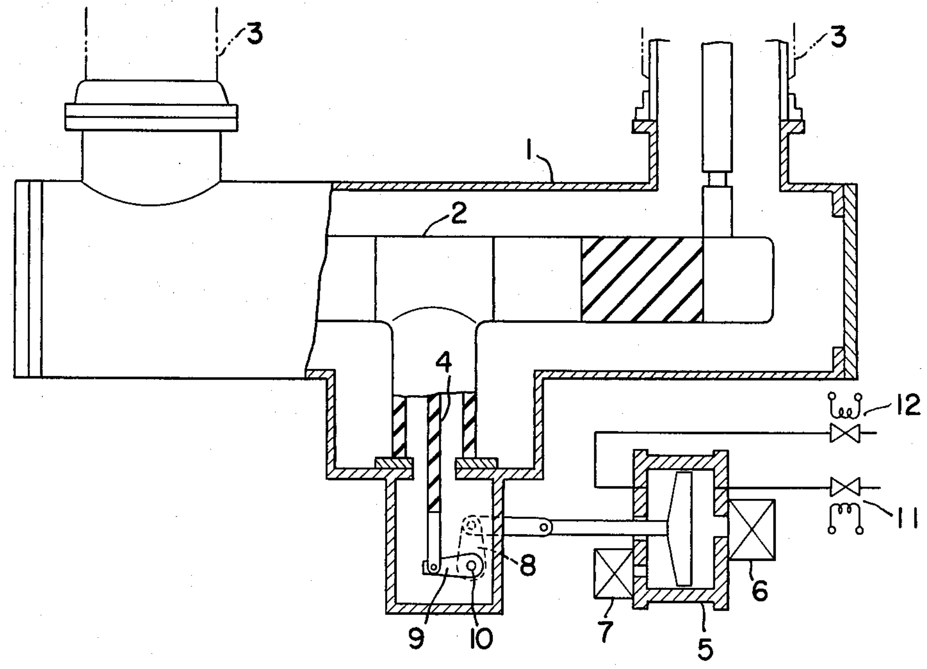
FIG. 2 is a view similar to FIG. 1 but embodying the invention.

Turning now to a preferred embodiment of this invention shown in FIG. 2 in which elements corresponding to those shown in FIG. 1 are designated by the same reference numerals, there are added a low speed drive valve 11 used for tripping the circuit breaker and a low speed drive valve 12 used for closing the circuit breaker. Where the movable contact of the circuit breaker is to be moved at an extremely low speed, control valves 6 and 7 shown in FIGS. 1 and 2 may be combined. In most cases, however, as these control valves 6 and 7 are generally designed for high speed operation, such design accompanies difficult technical problems as the diameter of the operating cylinder and the set point of the pressure supplied to the cylinder. The apparatus shown in FIG. 2 is different from that shown in FIG. 1 in that there are provided additional drive valves 11 and 12 which are used to move at a low speed, i.e. a speed lower than normal speed, the movable contact of the circuit breaker at the time of detecting abnormal conditions.

Figure 3:
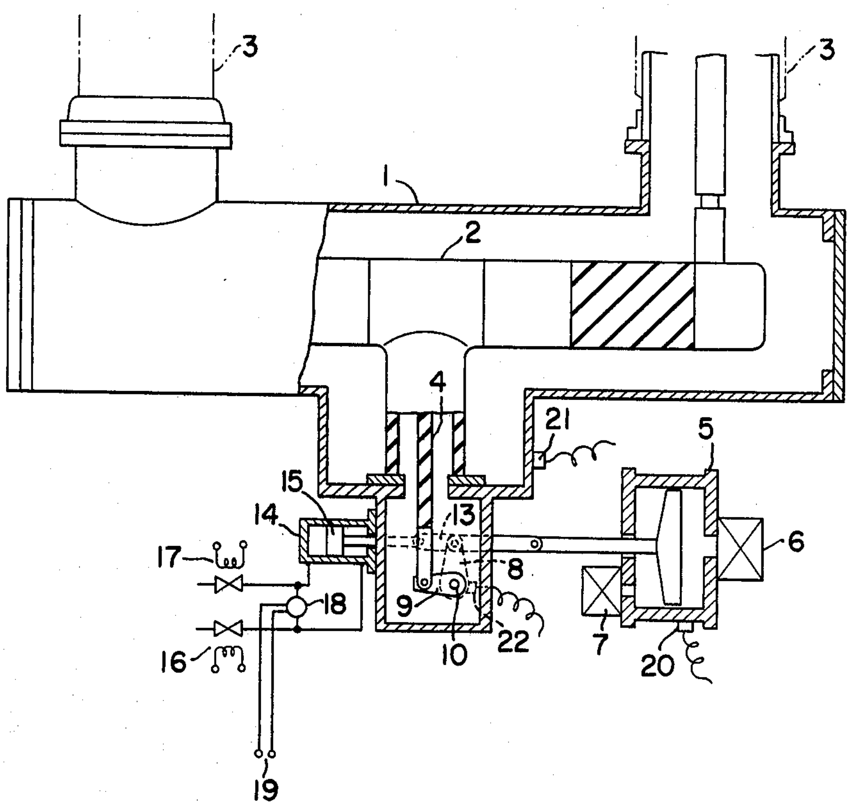
FIG. 3 is a view similar to FIG. 1 but showing a modified embodiment of this invention.

In another embodiment of this invention shown in FIG. 3, a piston 15 of a low speed cylinder 14 is connected to the crank arm 8 via a connecting lever 13. At the opposite ends of the cylinder 14 are provided electromagnetic valves 16 and 17 which are respectively used for tripping and closing of the circuit breaker at a low speed. A pressure converter 18 is provided for converting pressure differential at the opposite sides of the piston 15 into an electric signal lead out through terminals 19.

Although in this embodiment pressure converter 18 is illustrated as means for measuring the operating force of the low speed drive cylinder 14, any other pressure measuring means may also be used, for instance, a load cell, a strain gauge, etc.

Figure 4:
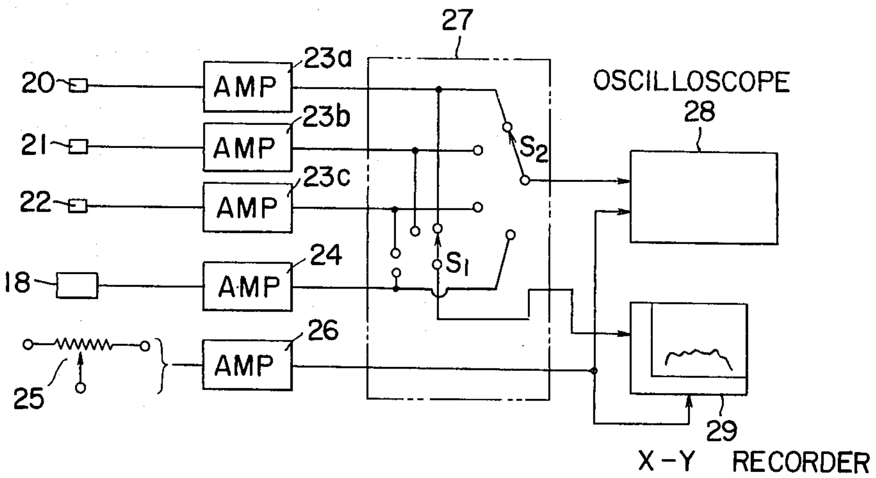
FIG. 4 is a block diagram showing one example of a measuring system embodying the invention.

FIG. 4 shows one example of a measuring system utilized in this invention in which 20–22 show piezoelectric type vibration-acceleration transducers mounted at predetermined positions of the drive cylinder 5 and the gas tank 1 (see FIG. 3) and their outputs are applied to amplifiers 23*a*–23*c*. The output of the pressure differential meter 18 is applied to an amplifier 24, and an output of a potential meter 25 which detects the stroke of the operating rod is applied to an amplifier 26. If necessary, these signals can be displayed on an electromagnetic oscilloscope 28 acting as a monitor or directly recorded with a X-Y (rectangular coordinates) recorder 29 via a transfer switch 27 including a pair of transfer switches $S_1$ and $S_2$ which selectively apply outputs of amplifiers 23*a*–23*c* to oscilloscope 28 and or X-Y recorder 29.

The operation of the detection apparatus of this invention will now be described with reference to FIGS. 5, 6 and 7. In one example shown in FIG. 5, a movable contact 32 of the circuit breaker and a high speed operating mechanism 31 are interconnected through a coupling pin 30 and the operating rod of the circuit breaker is supported by a bearing 33. A sluggish movement of the operating rod is shown at 34 while the stationary contact is shown at 35.

A low speed drive cylinder 14 is secured to the operating rod of a circuit breaker to be examined, and a pressure differential meter 18, a piezoelectric type vibration-acceleration transducer 20 and a stroke detection potentiometer 25 are mounted on predetermined positions. In FIG. 5, it is assumed that the sluggish movement occurs in the bearing 33 after the operating rod has moved over a stroke $X_1$, and that the contacts are closed after a stroke of $X_2$. An arrow A shows the closing direction.

Figure 5:
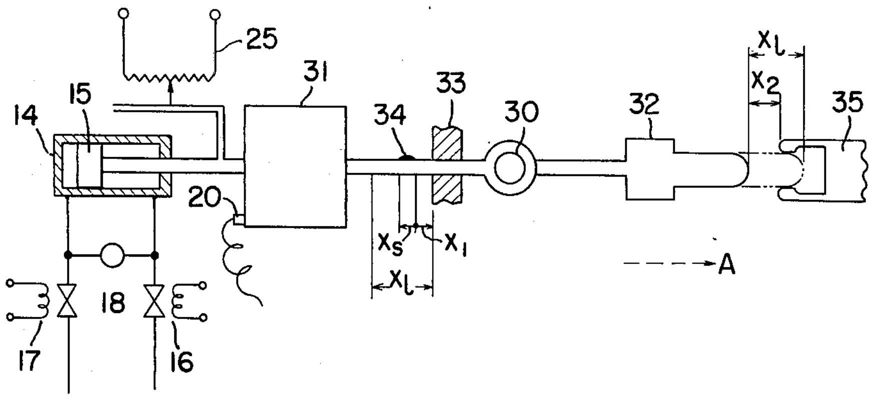
FIG. 5 is a diagrammatic representation of the detecting apparatus according to this invention.
Figure 6:
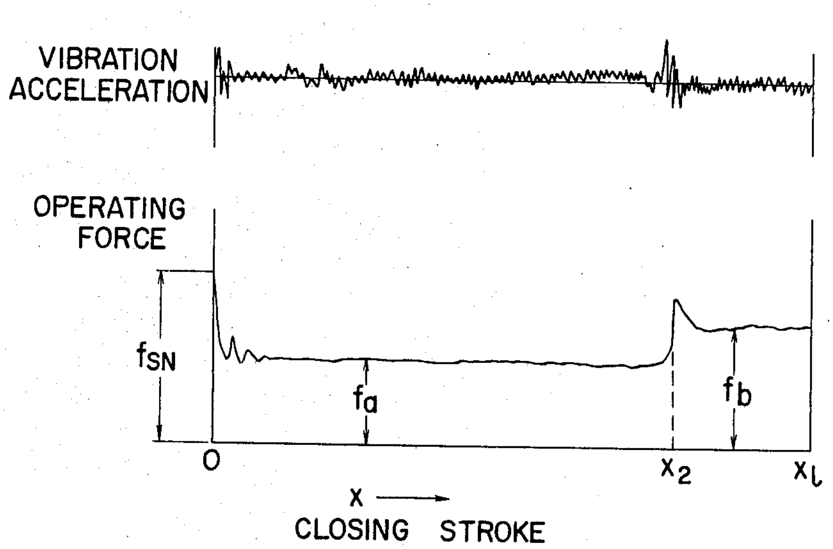
FIGS. 6 and 7 are graphs showing data measured with the method and apparatus according to this invention.

FIG. 6 is a graph showing a vibration-acceleration and an operating force obtained by the apparatus shown in FIG. 5 under normal conditions free from any sluggish movement.

The abscissa represents the closing stroke, while the ordinate represents the vibration-acceleration and the operating force. The operation force shows a large initial value $f_{SN}$ due to static friction, and then becomes a substantially constant value $f_a$ when the contacts are closed after a stroke $X_2$. It can be noted that a frictional force $f_b$–$f_a$ is applied onto the contacts between strokes $X_2$ and $X_l$. On the other hand, the vibration-acceleration has a substantially constant width except at the start and at stroke $X_2$.

Figure 7:
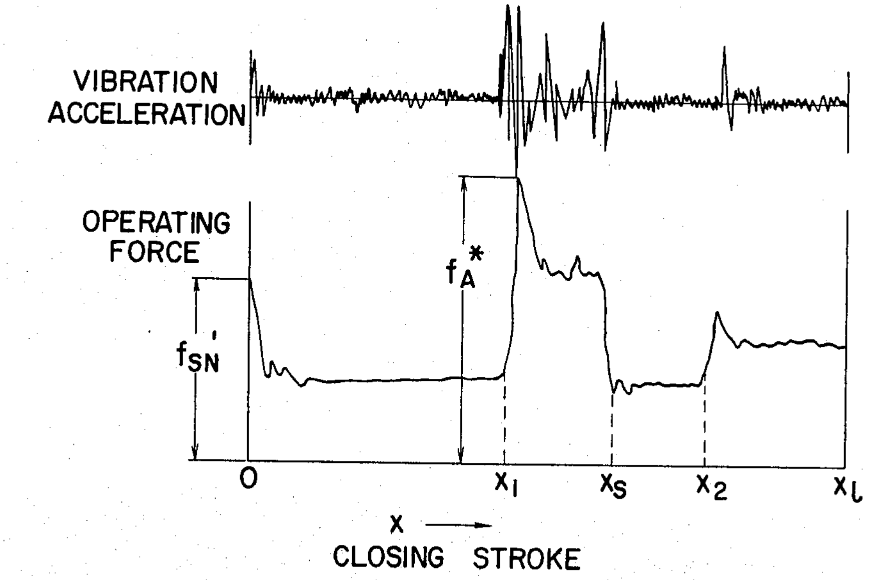

FIG. 7 is a graph showing variation of data caused by the sluggish movement 34 shown in FIG. 5. At $X_1$ of the closing stroke X, the operating force $f_a$ increases to a high value $f_A$* due to the friction caused by the sluggish movement while at the same time the vibration-acceleration also increases. Between strokes $X_1$ and $X_s$ the operating force increases to a high value due to the sluggish movement and then falls down to a normal value. At stroke $X_2$, the operating force increases slightly due to the friction between the contacts.

Although in the foregoing description nothing was mentioned about the variation in the amount of stroke of the movable contact it will be clear that the net variation in the operating force due to variation in friction causes a large variation in the amount of stroke.

Instead of normally mounting a low speed drive device on the circuit breaker, it may be mounted only at the time of examination. Further, instead of detecting abnormal conditions over the entire stroke of the movable contact such detection may be made at any points or sections of the stroke for detecting play or abnormal condition of movable portions.

The method and apparatus of this invention have the following advantages.

1. At the time of detection, since the circuit breaker is operated with an operating force and speed much lower than a normal operating force and speed, disturbances of the measured signals caused by vibrations at the time of operating the circuit breaker, exhaust noise and shocks are small. This improves the signal to noise ratio so that it is possible to obtain measured signals at high sensitivities.

2. Since the operating speed at the time of detection is low, measuring time is extending thus enabling amplification of the measured signals.

3. The detection can be made conveniently without disassembling or inspecting the circuit breaker.

4. In addition, it is possible to detect mechanical troubles at their early stages which may result in a serious fault so that reliability of the circuit breaker can be improved. According to the prior art method of detecting or inspecting mechanical troubles, it is necessary to disassemble the circuit breaker and then reassemble the same after inspection. The method of this invention can not only eliminate such labour and time but also prevent troubles caused by misassembling.

I claim:

1. A method of detecting an improper operating condition of a circuit breaker having contacts, at least one of which is movable, for opening and closing a circuit in an electric power line comprising the steps of:

driving a portion of said circuit breaker which moves during a contact opening and closing operation of said circuit breaker at a significantly lower speed than the speed which said movable portion moves during a normal, in use, contact opening or closing operation of said circuit breaker;

concurrently measuring a plurality of examination data regarding operating force and speed of said circuit breaker at the time of low speed drive; and, comparing said examination data with data representing characteristics of said circuit breaker when said movable portion is operated at said lower speed and in the absence of an improper operating condition of said circuit breaker.

2. An apparatus for detecting an improper operation condition of a circuit breaker having contacts provided inside a casing, at least one of which is movable, for opening and closing a circuit in an electric power line, said circuit breaker including an operating mechanism for operating said movable contact, said apparatus comprising:

means for driving said movable contact at a significantly lower speed than the speed with which said movable contact moves during a normal, in use, contact opening or closing operation of said circuit breaker;

a plurality of measuring units mounted on said casing for measuring a plurality of examination data and producing electric signals representing said measured examination data; and means for displaying said electric signals for comparison.

3. The apparatus according to claim 2 wherein said measuring units are mounted on said casing only when a measurement of examination data is to be made.

4. The apparatus according to claim 2 wherein said circuit breaker comprises a tank type gas circuit breaker and wherein said operating mechanism comprises a fluid piston-cylinder assembly provided with an inlet valve for admitting operating fluid into the cylinder at a predetermined high pressure and an exhaust valve, and said means for driving said movable contact at said low speed comprises another inlet valve for admitting the operating fluid at a lower pressure than said predetermined high pressure and another exhaust valve.

5. The apparatus according to claim 2 which further comprises another drive means connected to said movable contact for operating said movable contact at said low speed.

* * * * *